(12) United States Patent
Yuan

(10) Patent No.: US 9,121,444 B2
(45) Date of Patent: Sep. 1, 2015

(54) BEARING CUP STRUCTURE AND THERMAL MODULE THEREOF

(75) Inventor: Meihua Yuan, Shenzhen (CN)

(73) Assignee: Asia Vital Components (China) Co., Ltd., Shenzhen (CN)

( * ) Notice: Subject to any disclaimer, the term of this patent is extended or adjusted under 35 U.S.C. 154(b) by 783 days.

(21) Appl. No.: 13/429,906

(22) Filed: Mar. 26, 2012

(65) Prior Publication Data

US 2013/0248155 A1    Sep. 26, 2013

(51) Int. Cl.
| | |
|---|---|
| *F16C 35/00* | (2006.01) |
| *F16C 17/24* | (2006.01) |
| *F16C 35/02* | (2006.01) |
| *F16C 43/02* | (2006.01) |
| *H01L 23/467* | (2006.01) |

(52) U.S. Cl.
CPC .............. *F16C 17/243* (2013.01); *F16C 35/02* (2013.01); *F16C 43/02* (2013.01); *H01L 23/467* (2013.01); *H01L 2924/0002* (2013.01)

(58) Field of Classification Search
CPC ... F04D 25/062; F04D 25/0626; F16C 17/24; F16C 17/243; F16C 35/02
USPC ............. 415/175–178; 416/95, 174; 384/100, 384/226, 428
See application file for complete search history.

(56) References Cited

U.S. PATENT DOCUMENTS

| | | | | |
|---|---|---|---|---|
| 5,152,676 | A  * | 10/1992 | Ohi ............................ | 417/354 |
| 5,437,327 | A  * | 8/1995 | Chiou ........................ | 165/122 |
| 6,318,976 | B1 * | 11/2001 | Hsieh ..................... | 417/423.12 |
| 6,582,291 | B2 * | 6/2003 | Clark ........................ | 454/19 |
| 6,720,694 | B2 * | 4/2004 | Horng et al. ............... | 310/90 |
| 2003/0124000 | A1* | 7/2003 | Shih et al. ................. | 417/354 |
| 2006/0255674 | A1* | 11/2006 | Chen et al. ................ | 310/90 |
| 2008/0218018 | A1* | 9/2008 | Zhang et al. .............. | 310/90 |
| 2010/0266394 | A1* | 10/2010 | Luo .......................... | 415/177 |

* cited by examiner

*Primary Examiner* — Nathaniel Wiehe
*Assistant Examiner* — Woody A Lee, Jr.
(74) *Attorney, Agent, or Firm* — C. G. Mersereau; Nikolai & Mersereau, P.A.

(57) ABSTRACT

A bearing cup structure and a thermal module thereof. The bearing cup structure includes a cup body, a base seat, an assembling member and a retainer ring. The cup body has a receiving space and a fixing section formed at one end of the cup body. The base seat is received in the receiving space. The base seat has a first shoulder section, a second shoulder section and a receiving section. The assembling member is disposed in the receiving section and passes through the receiving section. The retainer ring is attached to the first shoulder section. With the bearing cup structure, the heat dissipation performance of the thermal module is greatly promoted and the assembling time is shortened to lower the manufacturing cost.

4 Claims, 7 Drawing Sheets

BEARING CUP STRUCTURE AND THERMAL MODULE THEREOF

BACKGROUND OF THE INVENTION

1. Field of the Invention

The present invention relates generally to a bearing cup structure and a thermal module thereof. With the bearing cup structure, the heat dissipation area of the thermal module is increased to greatly promote the heat dissipation performance. Moreover, the assembling time is shortened to lower the manufacturing cost.

2. Description of the Related Art

Following the rapid development of electronic information sciences and techniques, all kinds of electronic products (such as computers) have been more and more popularly used and widely applied to various fields. There is a trend to increase processing speed and expand access capacity of the electronic products. Therefore, the electronic components of the electronic products have operated at higher and higher speed. When operating at high speed, the electronic components generate high heat at the same time.

With a computer taken as an example, when the computer operates at high speed, the central processing unit (CPU) in the computer will generate high heat to result in unstable operation of the CPU. In case the heat is not efficiently dissipated, the temperature of the CPU will rise very quickly to cause crash of the computer. In some serious cases, the CPU may even burn down. Therefore, it has become a critical issue how to quickly conduct out and dissipate the heat generated by the CPU and other heat-generating components.

Conventionally, a thermal module is arranged on the CPU to dissipate heat generated by the CPU. The thermal module is mainly composed of a fan and a heat dissipation unit. The fan is locked on the heat dissipation unit, while the heat dissipation unit is disposed on the CUP. The heat generated by the CPU in operation on one hand is dissipated by the heat dissipation unit and on the other hand is carried away by the wind blown to the heat dissipation unit by the fan. Accordingly, the heat is continuously carried away from the heat dissipation unit to avoid overheating of the CPU and thus avoid deterioration of working efficiency of the CPU.

Please refer to FIGS. 1A and 1B. FIG. 1A is a perspective exploded view of a conventional thermal module. FIG. 1B is a perspective assembled view of the conventional thermal module. The conventional thermal module 1 includes a fan 10, a base seat 11 and a heat dissipation unit 12. The heat dissipation unit 12 has a main body 121 and multiple radiating fins 122 extending from the main body. The base seat 11 is fixedly disposed on the main body 121. Multiple locating sections 111 extend from a periphery of the base seat 11. Each locating section 111 has at least one locating hole 1111. A locking member 13 is passed through the locating hole 1111 to lock the base seat 11 on the heat dissipation unit 12. Such thermal module 1 has a structure necessitating a large axial room so that the thermal module 1 has a considerably large volume to occupy much space. The base seat 11 locked on the heat dissipation unit 12 occupies a certain height and area so that the heat dissipation unit 12 must have a sufficient height for installing the fan 10. As a result, the resistance against airflow of the fan 10 is increased. This will affect the heat dissipation performance of the heat dissipation unit 12 and reduce the heat dissipation area of the radiating fins 122.

Moreover, the locating sections 111 must be locked on the heat dissipation unit 12 by means of the locking members 13 passing through the locating holes 1111. Such assembling process is quite time-consuming so that the manufacturing cost is increased.

According to the above, the conventional thermal module has the following shortcomings:
1. The heat dissipation performance is deteriorated.
2. The heat dissipation area is reduced.
3. It is time-consuming to assemble the components.
4. The manufacturing cost is increased.

SUMMARY OF THE INVENTION

A primary object of the present invention is to provide a bearing cup structure, which is able to increase the heat dissipation area of the thermal module so as to greatly promote the heat dissipation performance of the thermal module.

A further object of the present invention is to provide the above bearing cup structure, which can be assembled in a shorter time to lower manufacturing cost.

A still further object of the present invention is to provide a thermal module, which has larger heat dissipation area and better heat dissipation performance.

A still further object of the present invention is to provide the above thermal module, which can be assembled in a shorter time to lower manufacturing cost.

To achieve the above and other objects, the bearing cup structure of the present invention includes a cup body, a base seat, an assembling member and a retainer ring. The cup body has a receiving space and a fixing section. The fixing section is formed at one end of the cup body. The base seat is received in the receiving space. The base seat is received has a first shoulder section, a second shoulder section and a receiving section. The assembling member is disposed in the receiving section and passes through the receiving section.

The assembling member has a head section radially outward extending from the assembling member. The head section is attached to the second shoulder section. The retainer ring is attached to the first shoulder section. The retainer ring is formed with a hole in communication with the receiving section. With the bearing cup structure, the heat dissipation area of the thermal module is greatly increased to promote the heat dissipation performance of the thermal module. Moreover, the assembling time is shortened to lower the manufacturing cost.

The thermal module of the present invention includes a heat dissipation unit, a cup body, a base seat, an assembling member, a retainer ring and a fan impeller assembly. The heat dissipation unit has a main body and multiple radiating fins extending from a periphery of the main body. A center of the main body is formed with a locating section. The locating section includes a fixing cavity and a locating hole in communication with the fixing cavity. The cup body has a receiving space and a fixing section. The fixing section is formed at one end of the cup body and affixed to the fixing cavity. The base seat is received in the receiving space. The base seat has a first shoulder section, a second shoulder section and a receiving section. The assembling member passes through the receiving section and extends into the locating hole. The assembling member has a head section radially outward extending from the assembling member. The head section is attached to the second shoulder section. The retainer ring is attached to the first shoulder section. The retainer ring is formed with a hole in communication with the receiving section. The fan impeller assembly has a shaft rod extending from the fan impeller assembly and received in the receiving space. The shaft rod passes through the hole and extends into the receiving section. An elastic member is disposed at a first end of the shaft rod, which end is adjacent to the fan impeller assembly. A second end of the shaft rod opposite to the first end is formed with an engagement groove. The retainer ring is correspondingly engaged in the engagement groove. The thermal module has larger heat dissipation area and better heat dissipation performance. Moreover, the thermal module can be assembled in a shorter time to lower manufacturing cost.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
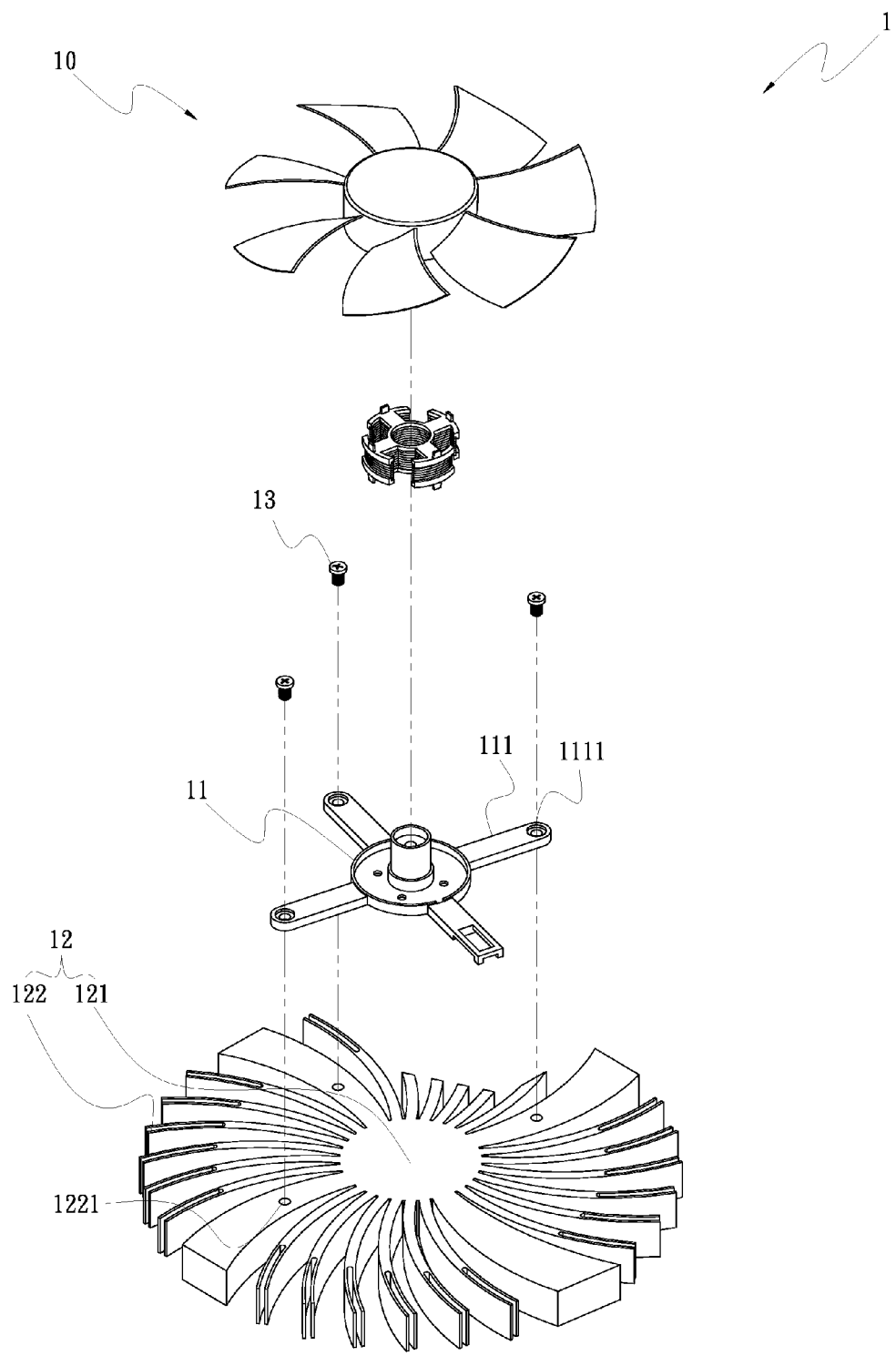
FIG. 1A is a perspective exploded view of a conventional thermal module.
Figure 1B:
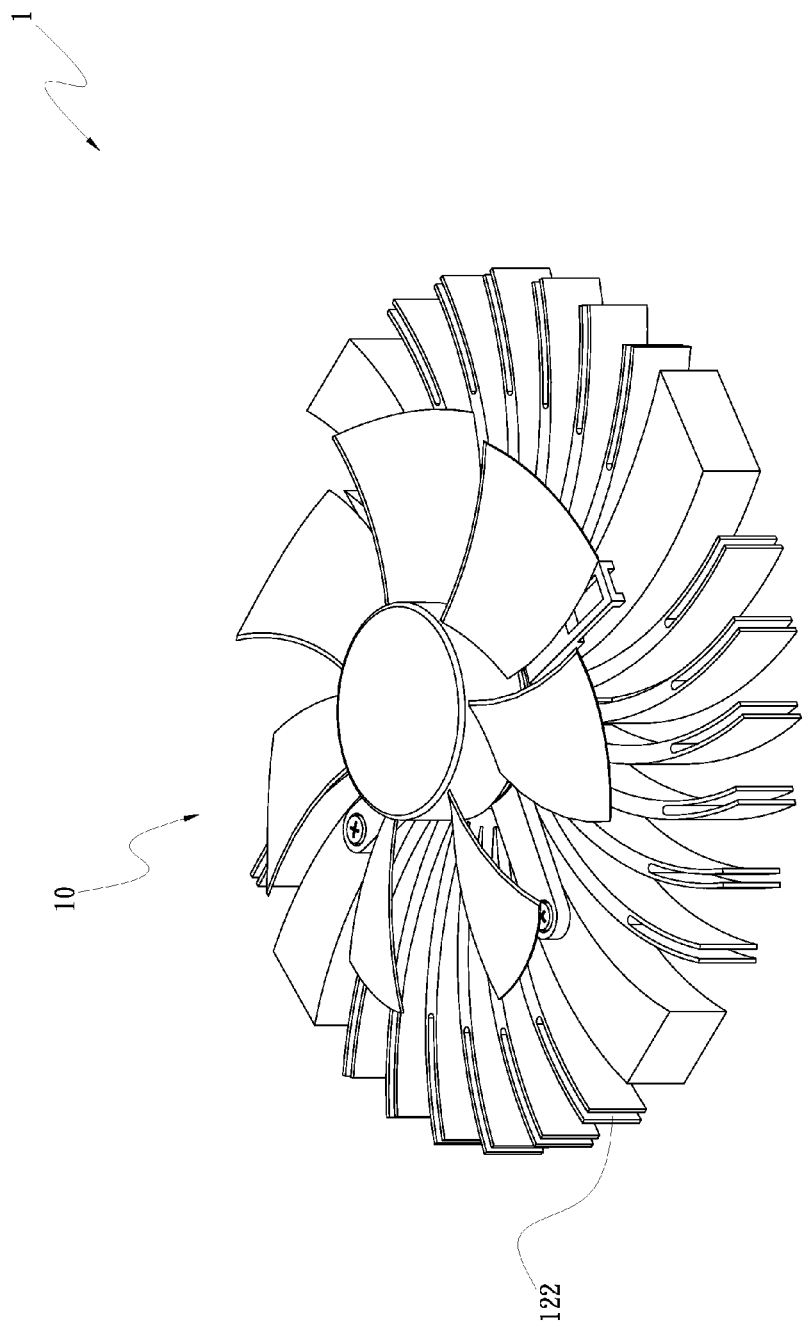
FIG. 1B is a perspective assembled view of the conventional thermal module.
Figure 2A:
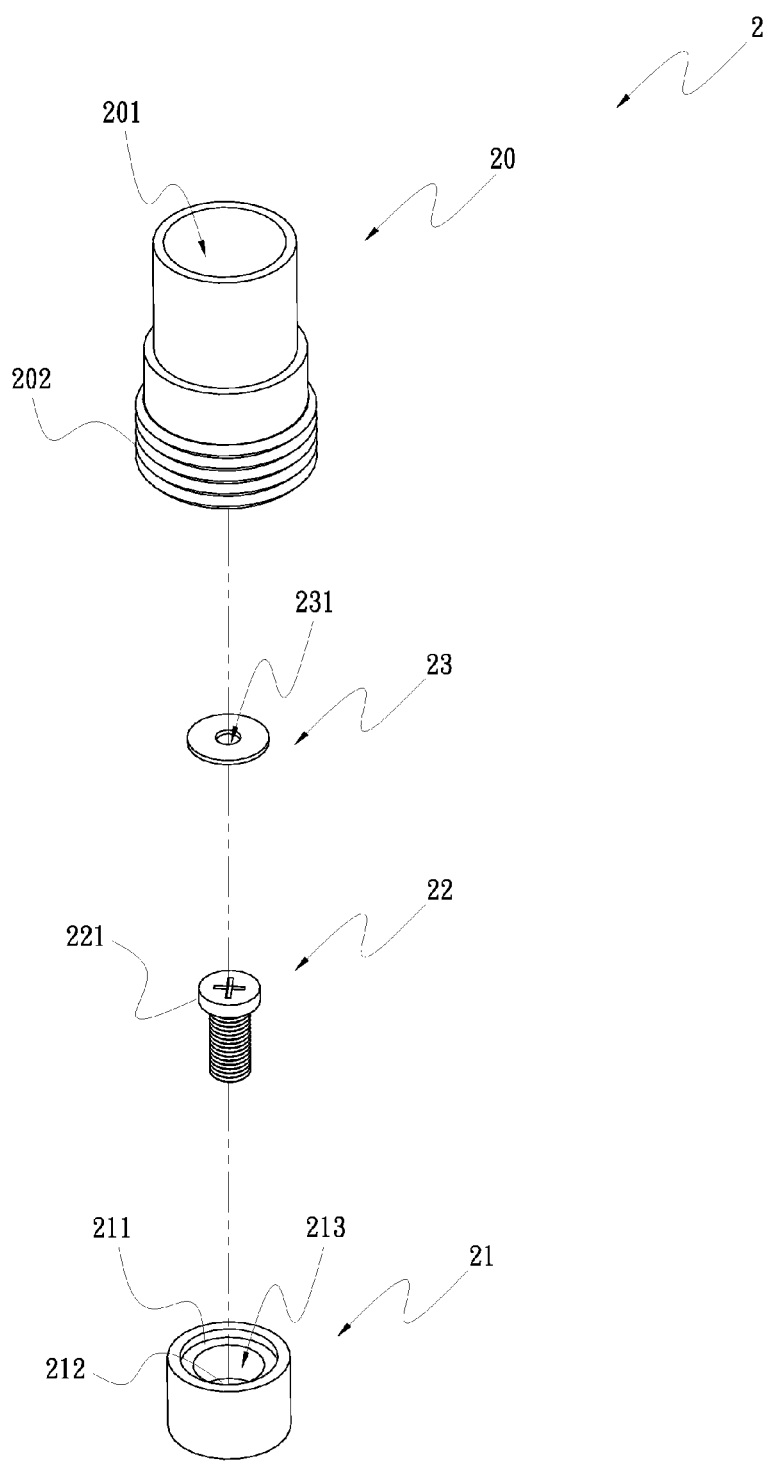
FIG. 2A is a perspective exploded view of a first embodiment of the bearing cup structure of the present invention.
Figure 2B:
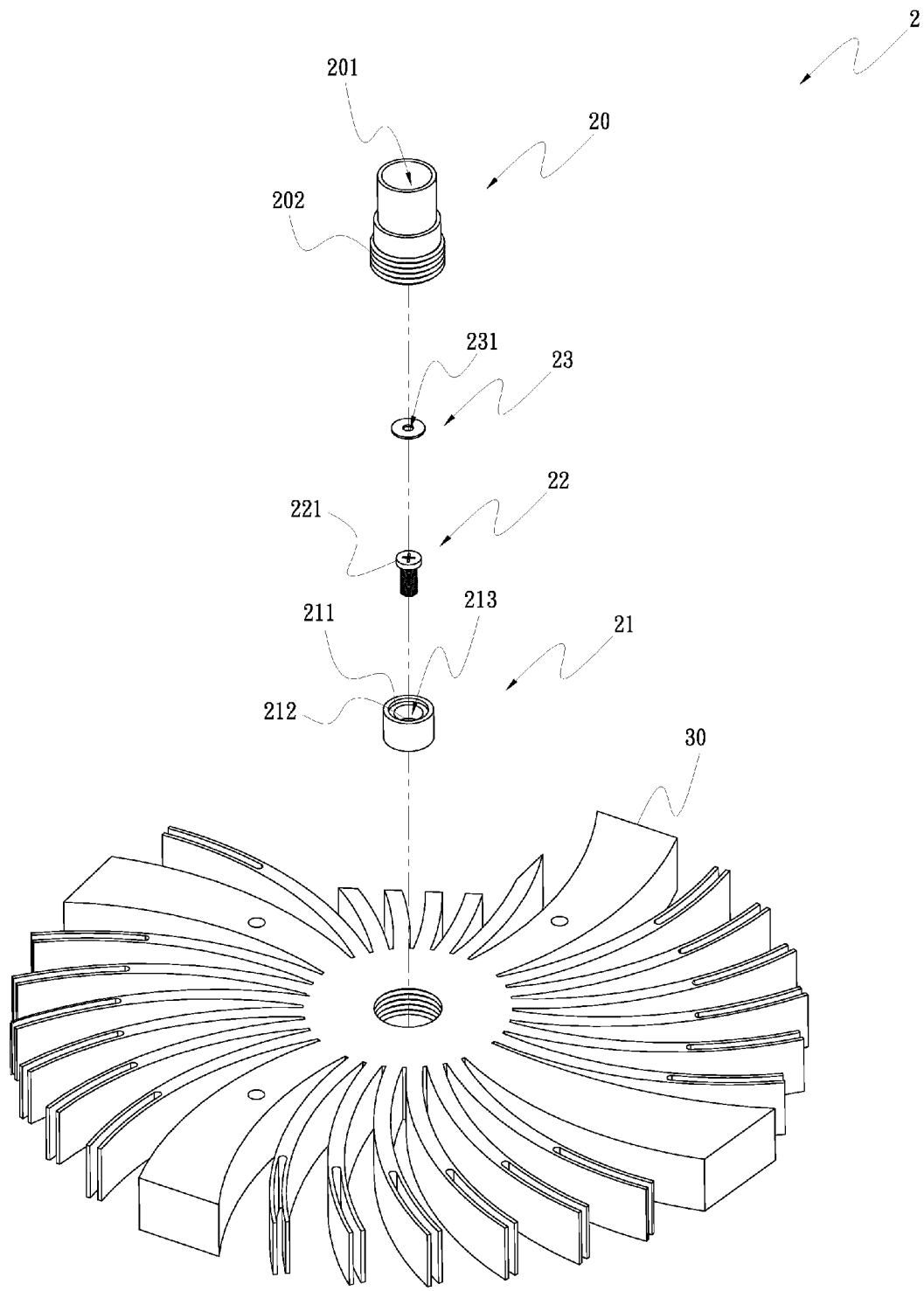
FIG. 2B is a perspective exploded view of the first embodiment of the bearing cup structure of the present invention, also showing a heat dissipation unit on which the cup body is fixed.

Please refer to FIGS. 2A and 2B. FIG. 2A is a perspective exploded view of a first embodiment of the bearing cup structure of the present invention. FIG. 2B is a perspective exploded view of the first embodiment of the bearing cup structure of the present invention, also showing a heat dissipation unit on which the cup body is fixed. According to this embodiment, the bearing cup structure 2 of the present invention includes a cup body 20, a base seat 21, an assembling member 22 and a retainer ring 23. The cup body 20 has a receiving space 202 and a fixing section 202. The fixing section 202 is formed at one end of the cup body 20. The base seat 21 is received in the receiving space 201. The base seat 21 has a first shoulder section 211 and a second shoulder section 212 and a receiving section 213 in communication with the receiving space 201. The assembling member 22 is disposed in the receiving section 213 and passes through the receiving section 213. The assembling member 22 has a head section 221 radially outward extending from the assembling member 22. Preferably, the assembling member 22 is a screw or a bolt. The head section 221 is attached to the second shoulder section 212, while the retainer ring 23 is attached to the first shoulder section 211. The retainer ring 23 is formed with a hole 231 in communication with the receiving section 213.

Please further refer to FIG. 2B. The bearing cup structure 2 is fixed on a heat dissipation unit 30. The bearing cup structure 2 has smaller volume and is free from the conventional base seat and locating sections so that the occupied room is reduced and the heat dissipation area of the heat dissipation unit 30 is increased to greatly promote the heat dissipation performance. In addition, the bearing cup structure 2 of the present invention can be affixed onto the heat dissipation unit 30 without using the conventional base seat and locating sections. Therefore, the cost for making the molds of the conventional base seat and locating sections is saved. Also, the bearing cup structure 2 is located at one single point instead of the multiple points of the conventional structure so that the assembling time is shortened to increase the production efficiency and greatly lower the manufacturing cost.

Figure 3A:
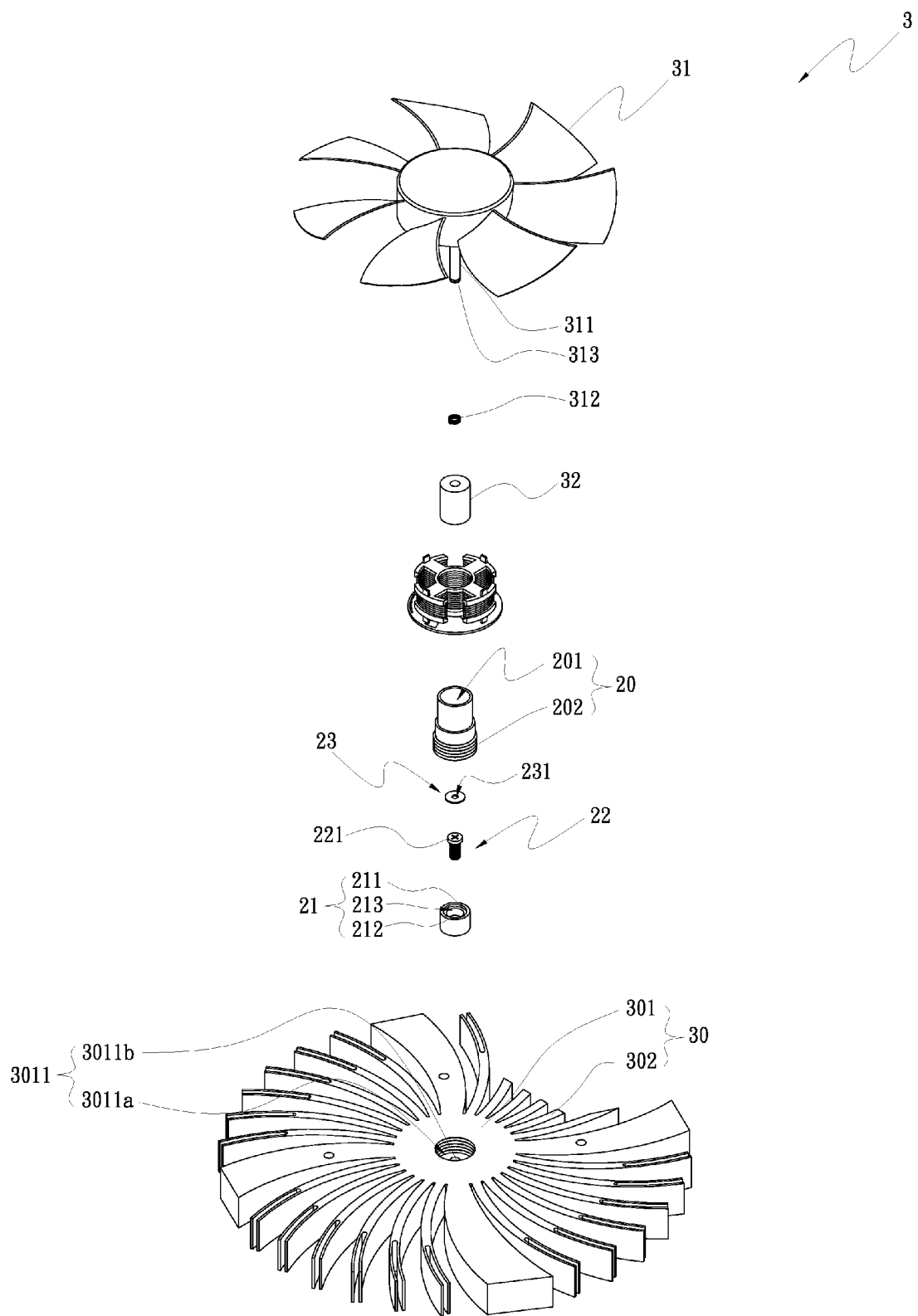
FIG. 3A is a perspective exploded view of a first embodiment of the thermal module of the present invention.
Figure 3B:
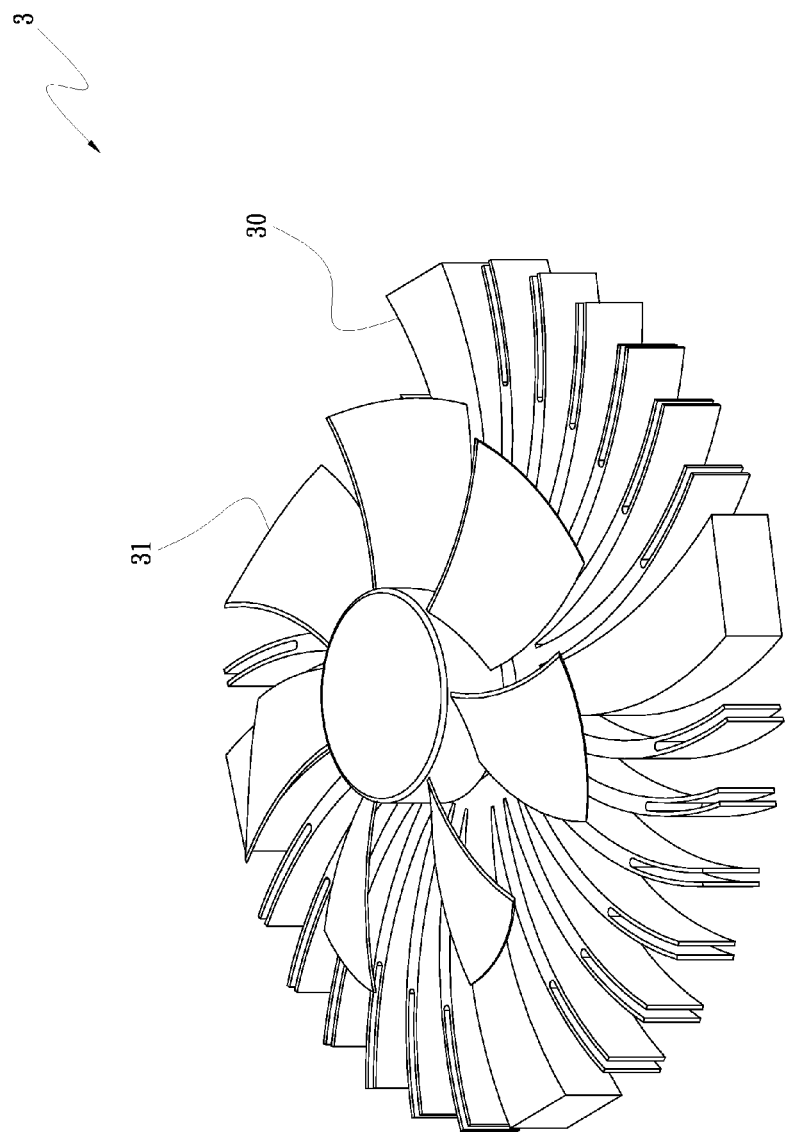
FIG. 3B is a perspective assembled view of the first embodiment of the thermal module of the present invention.
Figure 3C:
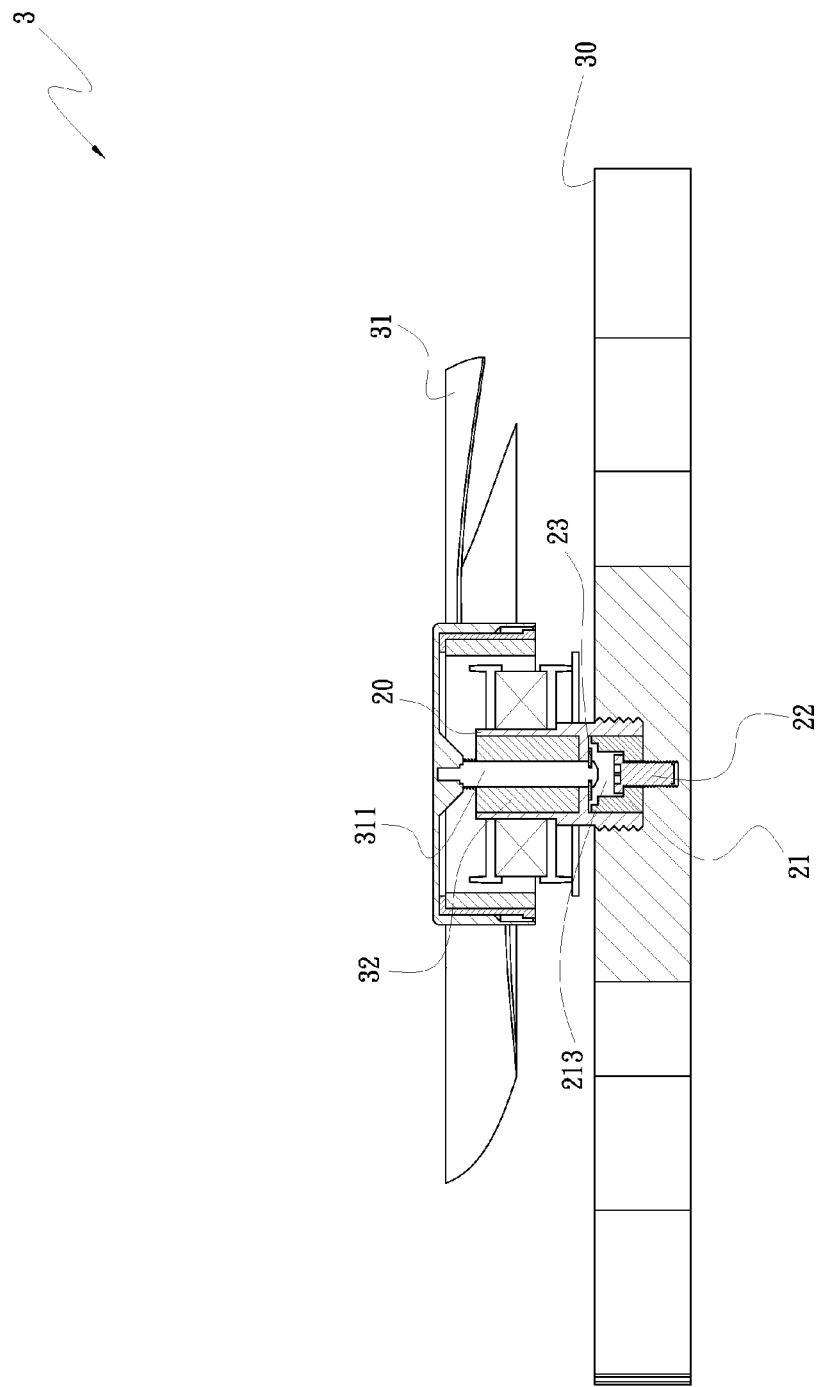
FIG. 3C is a sectional assembled view of the first embodiment of the thermal module of the present invention.

Please refer to FIGS. 3A, 3B and 3C. FIG. 3A is a perspective exploded view of a first embodiment of the thermal module of the present invention. FIG. 3B is a perspective assembled view of the first embodiment of the thermal module of the present invention. FIG. 3C is a sectional assembled view of the first embodiment of the thermal module of the present invention. According to this embodiment, the above bearing cup structure 2 is applied to the thermal module 3. The thermal module 3 of the present invention includes a heat dissipation unit 30, a cup body 20, a base seat 21, an assembling member 22, a retainer ring 23 and a fan impeller assembly 31. The heat dissipation unit 30 has a main body 301 and multiple radiating fins 302 extending from a periphery of the main body 301. A center of the main body 301 is formed with a locating section 3011. The locating section 3011 includes a fixing cavity 3011a and a locating hole 3011b in communication with the fixing cavity 3011a. The cup body 20 has a receiving space 201 and a fixing section 202. The fixing section 202 is formed at one end of the cup body 20 and affixed to the fixing cavity 3011a. The base seat 21 is received in the receiving space 201. The base seat 21 has a first shoulder section 211 and a second shoulder section 212 and a receiving section 213 in communication with the receiving space 201. The assembling member 22 passes through the receiving section 213 and extends into the locating hole 3011b. The assembling member 22 has a head section 221 radially outward extending from the assembling member 22. The head section 221 is attached to the second shoulder section 212. The assembling member 22 can be a screw or a bolt. The retainer ring 23 is attached to the first shoulder section 211. The retainer ring 23 is formed with a hole 231 in communication with the receiving section 213.

The fan impeller assembly 31 has a shaft rod 311 extending from the fan impeller assembly 31 and received in the receiving space 201. The shaft rod 311 passes through the hole 231 and extends into the receiving section 213. An elastic member 312 is disposed at a first end of the shaft rod 311, which end is adjacent to the fan impeller assembly 31. The elastic member 312 can be a spring or a steel leaf spring. A second end of the shaft rod 311 opposite to the first end is formed with an engagement groove 313. The retainer ring 23 is correspondingly engaged in the engagement groove 313.

The thermal module 3 further includes at least one bearing 32 fitted on the shaft rod 311 and received in the receiving space 201.

According to the above arrangement, after the bearing cup structure 2 of the thermal module 3 is fixed onto the heat dissipation unit 30, an external force is applied from upper side to the fan impeller assembly 31 to make the shaft rod 311 pass through the receiving space 201 of the cup body 20 and the hole 231 of the retainer ring 23. Then the retainer ring 23 is fixedly engaged into the engagement groove 313 of the second end of the shaft rod 311. Under such circumstance, under the elastic force of the elastic member 312 disposed at the first end of the shaft rod 311, the shaft rod 311 will pull up the retainer ring 23 to make the retainer ring 23 tightly attach to the bearing 32 and complete the assembly of the fan impeller assembly 31 and the heat dissipation unit 30. Accordingly, the bearing cup structure 2 can be affixed onto the heat dissipation unit 30 without using the conventional base seat and locating sections. Therefore, the heat dissipation area of the heat dissipation unit 30 is increased to greatly promote the heat dissipation performance thereof. In addition, the cup body 20 is located at one single point instead of the multiple points of the conventional structure so that the assembling time is shortened to increase the production efficiency and greatly lower the manufacturing cost.

According to the above, in comparison with the conventional thermal module, the present invention has the following advantages:

1. The heat dissipation performance is promoted.
2. The heat dissipation area is increased.
3. The assembling process is simplified to save time.
4. The manufacturing cost is lowered.

The above embodiments are only used to illustrate the present invention, not intended to limit the scope thereof. It is understood that many changes and modifications of the above embodiments can be made without departing from the spirit of the present invention. The scope of the present invention is limited only by the appended claims.

What is claimed is:

1. A thermal module comprising:

a heat dissipation unit having a main body and multiple radiating fins extending from a periphery of the main body, a center of the main body being formed with a locating section, the locating section including a fixing cavity and a locating hole in communication with the fixing cavity;

a cup body having a receiving space and a fixing section, the fixing section being formed at one end of the cup body and affixed to the fixing cavity;

a base seat received in the receiving space, the base seat having a first shoulder section, a second shoulder section and a receiving section;

an assembling member passing through the receiving section and extending into the locating hole, the assembling member having a head section radially outward extending from the assembling member, the head section being attached to the second shoulder section;

a retainer ring attached to the first shoulder section, the retainer ring being formed with a hole in communication with the receiving section; and a fan impeller assembly having a shaft rod extending from the fan impeller assembly and received in the receiving space, the shaft rod passing through the hole and extending into the receiving section, an elastic member being disposed at a first end of the shaft rod, which end is adjacent to the fan impeller assembly, a second end of the shaft rod opposite to the first end being formed with an engagement groove, the retainer ring being correspondingly engaged in the engagement groove.

2. The thermal module as claimed in claim 1, wherein the elastic member is a spring or a steel leaf spring.

3. The thermal module as claimed in claim 1, further comprising at least one bearing fitted on the shaft rod.

4. The thermal module as claimed in claim 1, wherein the assembling member is a screw or a bolt.

* * * * *